(12) United States Patent
Hemley et al.

(10) Patent No.: US 7,754,180 B2
(45) Date of Patent: Jul. 13, 2010

(54) ULTRAHARD DIAMONDS AND METHOD OF MAKING THEREOF

(75) Inventors: Russell J. Hemley, Chevy Chase, MD (US); Ho-Kwang Mao, Washington, DC (US); Chih-shiue Yan, Washington, DC (US)

(73) Assignee: Carnegie Institution of Washington, Washington, DC (US)

( * ) Notice: Subject to any disclaimer, the term of this patent is extended or adjusted under 35 U.S.C. 154(b) by 266 days.

(21) Appl. No.: 11/979,699

(22) Filed: Nov. 7, 2007

(65) Prior Publication Data

US 2008/0241049 A1 Oct. 2, 2008

Related U.S. Application Data

(60) Continuation of application No. 11/401,288, filed on Apr. 11, 2006, now Pat. No. 7,309,477, which is a division of application No. 10/889,170, filed on Jul. 13, 2004, now Pat. No. 7,115,241.

(60) Provisional application No. 60/486,435, filed on Jul. 14, 2003.

(51) Int. Cl.
C01B 31/06 (2006.01)
(52) U.S. Cl. ........................ 423/446; 117/929
(58) Field of Classification Search ............... 423/446; 117/79, 929
See application file for complete search history.

(56) References Cited

U.S. PATENT DOCUMENTS 6,582,513 B1 6/2003 Linares et al. ............... 117/93
7,309,477 B2* 12/2007 Hemley et al. .............. 423/446

2003/0230232 A1 12/2003 Frushour et al. ............ 117/68

FOREIGN PATENT DOCUMENTS

WO WO 01/96633 A1 12/2001

OTHER PUBLICATIONS

Shigley et al., Gemological Identification of HPHT-Annealed, Seventh Annual V.M. Goldschmidt Conference (2001).*
Collins, et al., Colour changes produced in natural brown diamonds by high-pressure, high-temperature treatment, Diamond and Related Materials 2000; 9: 113-122.*
Van Royen et al., High-pressure-high-temperature treatment of natural diamonds, J. Phys. Condens. Mater. 2002; 14: 10953-10956.*

(Continued)

Primary Examiner—Stanley S. Silverman
Assistant Examiner—Daniel C. McCracken
(74) Attorney, Agent, or Firm—Morgan, Lewis & Bockius LLP

(57) ABSTRACT

A single crystal diamond grown by microwave plasma chemical vapor deposition annealed at pressures in excess of 4.0 GPa and heated to temperature in excess of 1500 degrees C. that has a hardness of greater than 120 GPa. A method for manufacture a hard single crystal diamond includes growing a single crystal diamond and annealing the single crystal diamond at pressures in excess of 4.0 GPa and a temperature in excess of 1500 degrees C. to have a hardness in excess of 120 GPa.

1 Claim, 3 Drawing Sheets

OTHER PUBLICATIONS

Wang, Featured Lab Note: Another Commercial U.S. Facitlity Offering HPHT Annealing, GIA 2002: 38(2).*

Diamond 2003—Oral Programme, 14 European Conference on Diamond, Diamond-like Materials, Carbon Nanotubes, Nitrides and Silicon Carbide.

Chih-shiue Yan et al., "Very high growth rate chemical vapor deposition of single-crystal diamond" Oct. 1, 2002, vol. 99 No. 20, pp. 12523-12525.

Jan Isberg et al., "High Carrier Mobility in Single-Crystal Plasma-Deposited Diamond" Science, vol. 297, Issue 5587, 1670-1672, Sep. 6, 2002 [DOI: 10.1126/science.1074374].

Takahiro Imai et al., Synthesis of Large Free-Standing Diamond Single Crystals by Homoepitaxial Growth.

Patrick Doering et al., Large Area Single Crystal CVD Diamond: Properties and Applications.

Tetsuo Irifune et al., "Materials: Ultrahard Polycrystalline Diamond From Graphite", Nature 421, 599-600 (Feb. 6, 2003); doi:10.1038/421599b.

Wuyi Wang, Featured Lab Note: Another Commercial U.S. Facility Offers HPHT Annealing, Summer 2002, Gems & Gemology, vol. 38, Issue 2, Jul. 29, 2004.

M. D. Drory et al. "Fracture of Synthetic Diamond", Department of Materials Science and Engineering, (Received Mar. 10, 1995; accepted for publication May 11, 1995).

J.E. Shigley, et al., "Gemological Identification of HPHT-Annealed Diamonds", Seventh Annual V.M. Goldschmidt Conference (2001).

J. Van Royen et al., "High-pressure-high-temperature treatment of natural diamonds", J. Phys.: Condens. Matter, 14:10953-10956 (2002).

Collins et al., "Colour changes produced in natural brown diamonds by high-pressure, high-temperature treatment", Diamond and Related Materials, 9(2):113-122 (Mar. 2000).

* cited by examiner

ULTRAHARD DIAMONDS AND METHOD OF MAKING THEREOF

This application is a continuation of U.S. patent application Ser. No. 11/401,288, filed on Apr. 11, 2006 now U.S. Pat. No. 7,309,477 which is a divisional application of application Ser. No. 10/889,170, filed on Jul. 13, 2004 now U.S. Pat. No. 7,115,241 and claims the benefit of Provisional Application Ser. No. 60/486,435 filed on Jul. 14, 2003, which is hereby incorporated by reference.

STATEMENT OF GOVERNMENT INTEREST

This invention was made with U.S. government support under grant number EAR-0135626 from the National Science Foundation. The U.S. government has certain rights in the invention.

BACKGROUND OF THE INVENTION

1. Field of the Invention

The present invention relates to diamonds, and more particularly, to an ultrahard diamond produced using a Microwave Plasma Chemical Vapor Deposition (MPCVD) within a deposition chamber.

2. Description of Related Art

Large-scale production of synthetic diamond has long been an objective of both research and industry. Diamond, in addition to its gem properties, is the hardest known material, has the highest known thermal conductivity, and is transparent to a wide variety of electromagnetic radiation. Thus, diamond is valuable because of its wide range of applications in a number of industries, in addition to its value as a gemstone.

For at least the last twenty years, a process of producing small quantities of diamond by chemical vapor deposition (CVD) has been available. As reported by B. V. Spitsyn et al. in "Vapor Growth of Diamond on Diamond and Other Surfaces," Journal of Crystal Growth, vol. 52, pp. 219-226, the process involves CVD of diamond on a substrate by using a combination of methane, or another simple hydrocarbon gas, and hydrogen gas at reduced pressures and temperatures of 800-1200° C. The inclusion of hydrogen gas prevents the formation of graphite as the diamond nucleates and grows. Growth rates of up to 1 μm/hour have been reported with this technique.

Subsequent work, for example, that of Kamo et al. as reported in "Diamond Synthesis from Gas Phase in Microwave Plasma," Journal of Crystal Growth, vol. 62, pp. 642-644, demonstrated the use of Microwave Plasma Chemical Vapor Deposition (MPCVD) to produce diamond at pressures of 1-8 Kpa in temperatures of 800-1000° C. with microwave power of 300-700 W at a frequency of 2.45 GHz. A concentration of 1-3% methane gas was used in the process of Kamo et al. Maximum growth rates of 3 μm/hour have been reported using this MPCVD process.

Natural diamonds have a hardness between 80-120 GPa. Most grown or manufactured diamonds, regardless of the process, have a hardness of less than 110 GPa. Other than type IIa natural diamonds, which have been annealed, diamonds have not been reported to have a hardness of greater than 120 GPa.

SUMMARY OF THE INVENTION

Accordingly, the present invention is directed to a an apparatus and a method for producing diamond that substantially obviates one or more of the problems due to limitations and disadvantages of the related art.

An object of the present invention relates to an apparatus and method for producing diamond in a microwave plasma chemical vapor deposition system having increased hardness.

Another object of the present invention is to enhance the optical characteristics of a single crystal diamond.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a single crystal diamond grown by microwave plasma chemical vapor deposition annealed at pressures in excess of 4.0 GPa and heated to temperature in excess of 1500 degrees C. that has a hardness of greater than 120 GPa.

In another embodiment, A single crystal diamond having a hardness of 160-180 GPa In accordance with another embodiment of the present invention, A method for manufacture a hard single crystal diamond includes growing a single crystal diamond and annealing the single crystal diamond at pressures in excess of 4.0 GPa and a temperature in excess of 1500 degrees C. to have a hardness in excess of 120 GPa.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
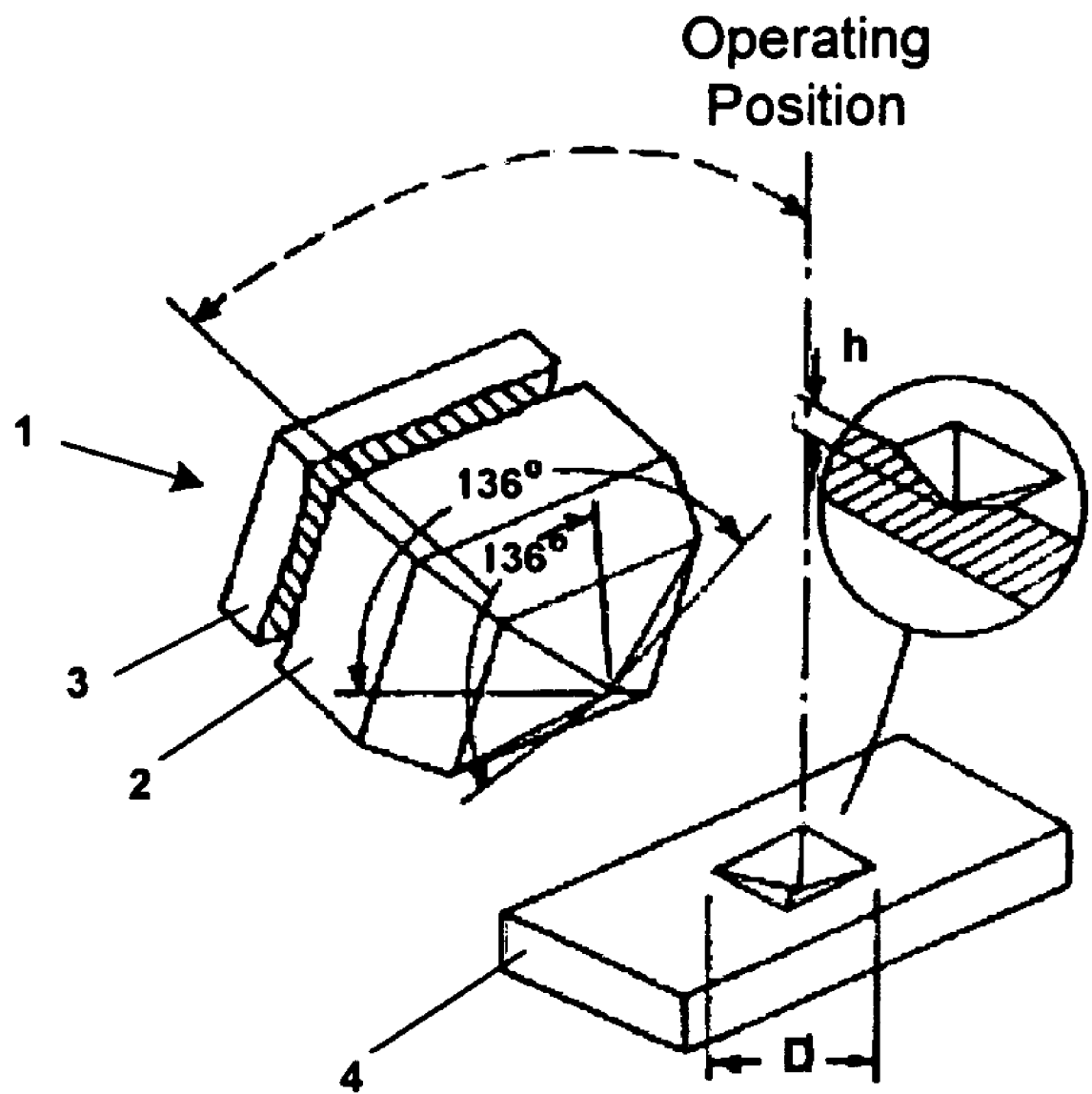
FIG. 1 is a diagram of an indenter for testing the hardness of a diamond.

Reference will now be made in detail to the preferred embodiments of the present invention, the results of which are illustrated in the accompanying drawings.

The microwave plasma CVD-grown single-crystal diamond referred to in this application were grown with the apparatus described in U.S. patent application Ser. No. 10/288,499 filed on Nov. 6, 2002 entitled "Apparatus and Method for Diamond Production," which is hereby incorporated by reference. In general, a seed diamond is placed in holder that moves the seed diamond/grown diamond as the diamond is grown. The inventors of this application are also inventors in U.S. patent application Ser. No. 10/288,499.

A microwave plasma CVD-grown single-crystal diamond having a thickness of greater than 1 millimeter was deposited on type Ib {100} synthetic diamond. In order to enhance the growth rate (50-150 μm/h) and promote smooth {100} face growth, single-crystal diamonds were grown in an atmosphere of $N_2/CH_4$=0.2-5.0%, $CH_4/H_2$=12-20%, 120-220 torr total pressure, and 900-1500° C. from a microwave induced plasma within a CVD chamber. Raman spectra show a small amount of hydrogenated amorphous carbon (a-C:H)[4] and nitrogen-containing a-C:H (N:a-C:H)[4] giving rise to brown diamond at <950° C. and >1400° C. Photoluminescence (PL) spectra indicate nitrogen-vacancy (N-V) impurities. Single crystal diamonds up to 4.5 mm in thickness have been fabricated at growth rates that are as much as two orders of magnitude higher than conventional polycrystalline CVD growth methods.

The microwave plasma CVD-grown single-crystal diamonds were annealed at pressures in excess of 4.0 GPa, such as 5-7 GPa, and heated to temperature in excess of 1500 degrees C., such as 1800-2900 degrees C., for 1-60 min in a reaction vessel using a belt-type or anvil-type apparatus. The reaction vessel can be a cell, such as that described in U.S. Pat. No. 3,745,623 or U.S. Pat. No. 3,913,280, which are hereby incorporated by reference. Such an annealing treatment, reduces or eliminates the color in the microwave plasma CVD-grown single-crystal diamond crystals, and lightening the tint of the type Ib HPHT synthetic seed crystals. Further, the hardness of the annealed microwave plasma CVD-grown single-crystal diamond annealed CVD diamond (at least ~140 GPa) is beyond that of annealed or unannealed type Ib HPHT synthetic diamond (~90 GPa), annealed type Ia natural diamond (~100 GPa), type IIa natural diamond (~110 GPa), and annealed type IIa natural diamond (~140 GPa) and sintered polycrystalline diamond (120-140 GPa).

EXAMPLE #1

A single crystal CVD diamond was grown with a $N_2/CH_4$ ratio of 5% at a temperature of approximately 1500 degrees C. on a yellow type Ib HPHT synthetic diamond in a microwave CVD chamber. The dimension of the microwave plasma CVD-grown single-crystal diamond was one centimeter square and a little larger than one millimeter in thickness. The color of the microwave plasma CVD-grown single-crystal diamond was brown. The brown microwave plasma CVD-grown single-crystal diamond on the type Ib HPHT synthetic seed diamond was then placed as a sample in the reaction vessel.

The reaction vessel was placed in a conventional HPHT apparatus. First, the pressure was increased to a pressure of 5.0 GPa, and then the temperature was brought up to 2200 degrees C. The sample was maintained at these annealing conditions for five minutes, and then the temperature was decreased over a period of about one minute to room temperature before the pressure was released.

The sample was removed from the reaction vessel and examined under an optical microscope. The brown microwave plasma CVD-grown single-crystal diamond had turned to a light green translucent color and remained firmly bonded to the yellow type Ib HPHT synthetic diamond. The yellow color of the type Ib HPHT synthetic diamond became a lighter yellow or a more translucent yellow. The hardness was about 160 GPa.

EXAMPLE #2

Same as example #1 above, except the annealing conditions were maintained for 1 hour. The brown microwave plasma CVD-grown single-crystal diamond turned to a light green color, which was more translucent than the light green color resulting in example #1, and remained firmly bonded to the type Ib HPHT synthetic diamond. The yellow color of the type Ib HPHT synthetic diamond became a lighter yellow or a more translucent yellow. The hardness was about 180 GPa.

EXAMPLE #3

A single crystal CVD diamond was grown with a $N_2/CH_4$ ratio of 5% at a temperature of approximately 1450 degrees C. on a yellow type Ib HPHT synthetic diamond in a microwave CVD chamber. The dimension of the microwave plasma CVD-grown single-crystal diamond was one centimeter square and a little larger than one millimeter in thick. The color of the microwave plasma CVD-grown single-crystal diamond was a light brown or yellow. In other words, a yellow or light brown that was not as dark as the brown of the microwave plasma CVD-grown single-crystal diamond in example #1 above. The yellow or light brown microwave plasma CVD-grown single-crystal diamond on the type Ib HPHT synthetic diamond was then placed as a sample in a reaction vessel. The hardness was greater than 160 GPa.

The reaction vessel was placed in a conventional HPHT apparatus. The pressure was increased to about to a pressure of 5.0 GPa, and then the temperature was rapidly brought up to about 2000 degrees C. The sample was maintained at these annealing conditions for five minutes, and then the temperature was decreased over a period of about one minute to room temperature before the pressure was released.

The sample was removed from the reaction vessel and examined under an optical microscope. The light brown microwave plasma CVD-grown single-crystal diamond had become colorless and remained firmly bonded to the yellow type Ib HPHT synthetic diamond. The yellow color of the type Ib HPHT synthetic diamond also became a lighter yellow or a more translucent yellow.

EXAMPLE #4

Same as example #1 except a colorless microwave plasma single-crystal CVD-grown diamond in an atmosphere of $N_2/CH_4$=5% at a temperature of ~1200 degree C. was annealed. After annealing, the microwave plasma single-crystal CVD-grown diamond was blue. This blue microwave plasma single-crystal CVD-grown diamond had a very high toughness of >20 MPa $m^{1/2}$. The hardness was about ~140 GPa.

EXAMPLE #5

Same as example #1 except a colorless microwave plasma single-crystal CVD-grown diamond in an atmosphere of $N_2/CH_4$=0.5% at a temperature of ~1200 degree C. was annealed. The microwave plasma single-crystal CVD-grown diamond was still colorless. This colorless microwave plasma single-crystal CVD-grown diamond had a hardness of ~160 GPa and toughness of ~10 MPa $m^{1/2}$.

FIG. 1 is a diagram of an indenter for testing the hardness of a diamond. A Vickers hardness test were performed on the annealed microwave plasma CVD-grown single-crystal diamonds with the indenter 1 shown in FIG. 1. The indenter 1 in FIG. 1 has an impinging material 2 positioned on a mount 3. The impinging material 2 can be silicon carbide, diamond or some other hard material. The impinging material has a face with a pyramidal Vickers indenter shape in which the sides of the pyramidal Vickers indenter shape have an angle of 136°.

Figure 2:
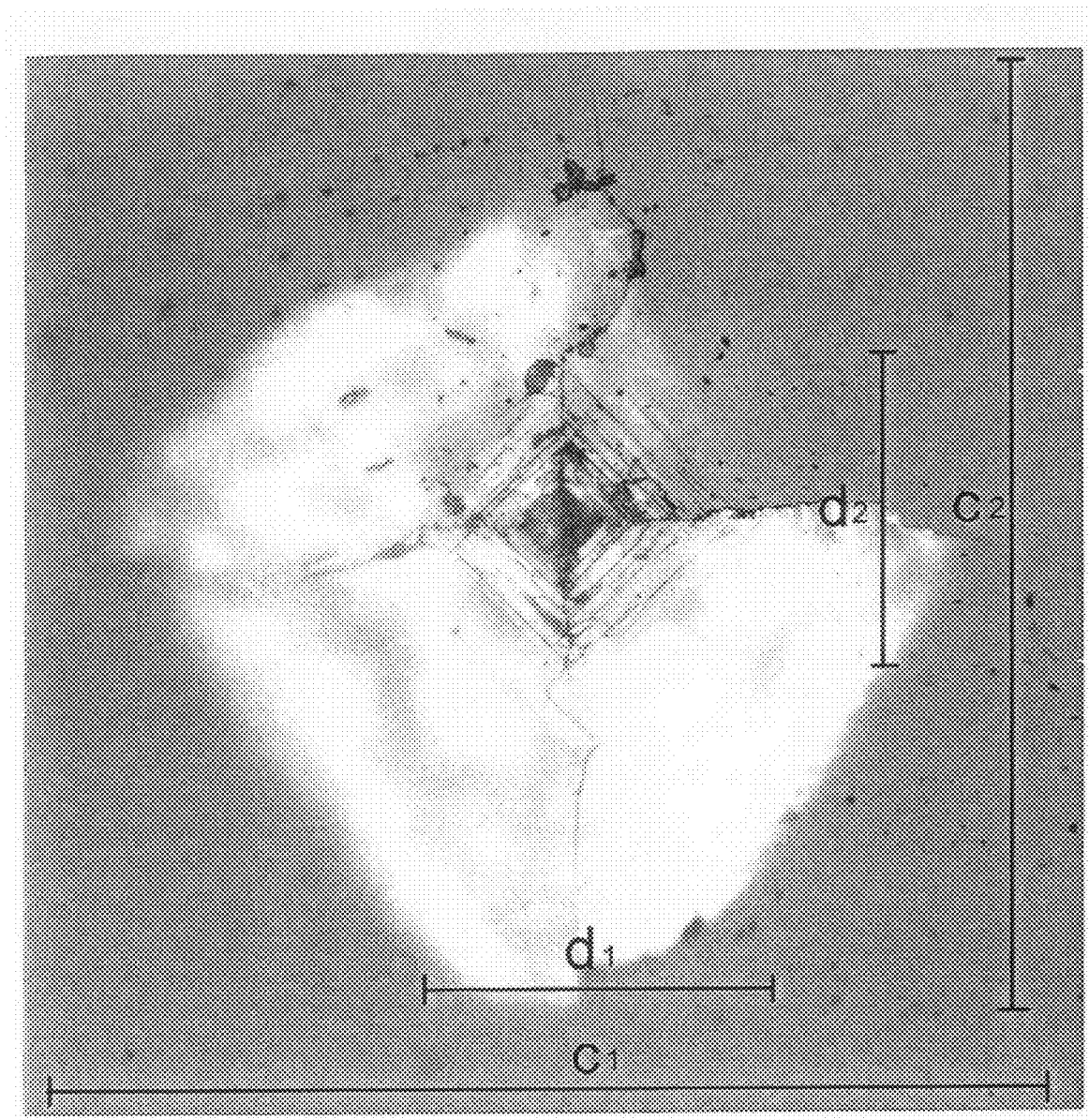
FIG. 2 is a picture of an indentation made on a diamond.

The indenter applies a point load to the test diamond 2 until an indentation or crack is formed in the test diamond 2. To prevent elastic deformation of the indenter, the loads were varied from 1 to 3 kg on {100} faces in the <100> direction of the test diamonds. Dimensions of the indentation and the cracks associate with the indentation are measured via optical microscopy. FIG. 2 is a picture of an indentation made on a microwave plasma CVD-grown single-crystal diamond.

By measuring the length D and height h of the indentation, the hardness $H_v$ of the test diamond can be determined from the following equation (1):

$$H_v = 1.854 \times P/D^2 \quad (1)$$

P is the maximum load used on the indenter to form an indentation into the test diamond. D is the length of the longest crack formed by the indenter in the test diamond and h is the depth of the indentation into the test diamond, as shown in FIG. 1.

The fracture toughness $K_c$ of the test diamond can be determined by using the hardness H, from equation (1) in the following equation (2):

$$K_c = (0.016 \pm 0.004)(E/H_v)^{1/2}(P/C^{3/2}) \quad (2)$$

E is the Young's modulus, which is assumed to be 1000 GPa. P is the maximum load used on the indenter to form the indentation into the test diamond. The term d is the average length of the indentation cavity in the test diamond, as shown in FIG. 2 such that $d=(d_1+d_2)/2$. The term c is the average length of the radial cracks in the test diamond, as shown in FIG. 2 such the $c=(c_1+c_2)/2$.

Because of the uncertainties in determining hardness, identical measurements were also performed on other diamonds. The measurements on other diamonds were found to be in agreement with published data on the other diamonds. The Vickers hardness tests were done on the (100) faces of the various types of diamonds in the (100) direction.

The indented surfaces of the annealed microwave plasma CVD-grown single-crystal diamonds as viewed by optical microscopy clearly differ from those of other (softer) diamonds. The annealed microwave plasma CVD-grown single-crystal diamond exhibits square crack patterns along <110> or <111>, no cross-like cracked lines along <100>, and a water-print-like deformation mark was produced on the surface of the annealed microwave plasma CVD-grown single-crystal diamond by the pyramidal Vickers indenter. In contrast, an annealed type IIa natural diamond has less square crack patterns along (110) and (111) but still exhibits the cross-like (100) cracks of softer diamonds. Such results indicate that annealed microwave plasma CVD-grown single-crystal diamond is harder than the indenter, and the pressure due to plastic deformation of the indenter causes slippage of the softer {111} faces.

The Vickers indenters typically cracked after ~15 measurements on unannealed microwave plasma CVD-grown single-crystal diamonds and type Ib natural diamonds. Further, The Vickers indenters typically cracked after ~5 measurements on annealed type IIa natural diamonds, annealed type Ia natural diamonds and annealed type Ib HPHT synthetic diamonds. However, the Vickers indenter cracked after only one or two measurements on the annealed microwave plasma CVD-grown single-crystal diamonds. These observations further indicate that the annealed microwave plasma CVD-grown single-crystal diamonds are harder than the measured values indicate. Indeed, many annealed microwave plasma CVD-grown single-crystal diamonds simply damaged the softer indenter. In such instances, the indenter left no imprint whatsoever in the surface of the annealed microwave plasma CVD-grown single-crystal diamonds.

Figure 3:
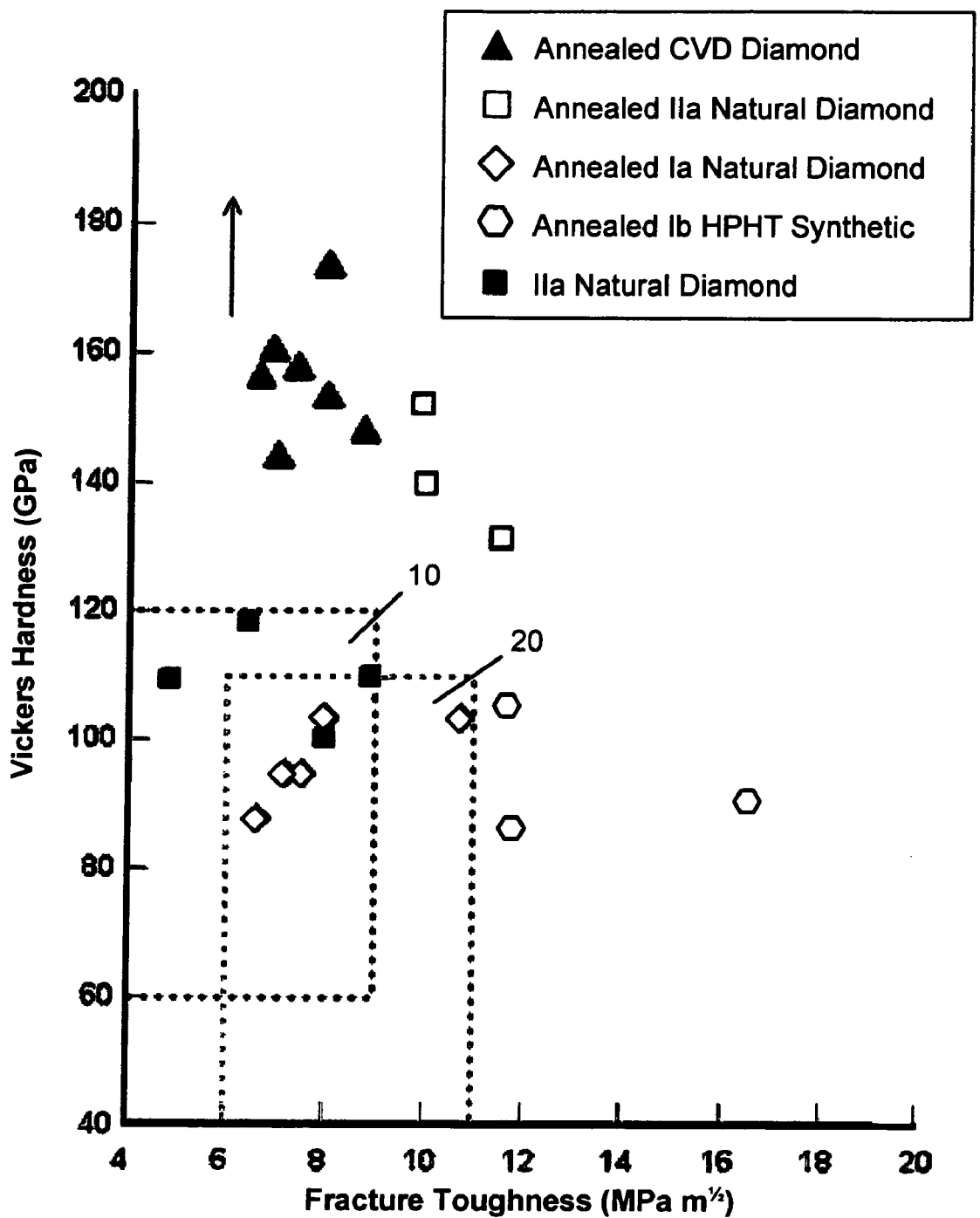
FIG. 3 is a graph showing the hardness and toughness of annealed microwave plasma CVD-grown single-crystal diamonds in comparison to type IIa natural diamonds annealed type IIa natural diamonds, annealed type Ia natural diamonds and annealed type Ib HPHT synthetic diamonds.

FIG. 3 is a graph showing the hardness and toughness of annealed microwave plasma CVD-grown single-crystal diamonds in comparison to type IIa natural diamonds annealed type IIa natural diamonds, annealed type Ia natural diamonds and annealed type Ib HPHT synthetic diamonds. As shown in FIG. 3, the annealed microwave plasma CVD-grown single-crystal diamonds have much higher hardness than type IIa natural diamond, as shown by the dotted square 10 in FIG. 3. All of the annealed microwave plasma CVD-grown single-crystal diamonds also have a higher hardness than the reported range the reported range of hardness for polycrystalline CVD diamonds, shown by the dotted square 20 in FIG. 3. The microwave plasma CVD-grown single-crystal diamonds represented in FIG. 3 have a fracture toughness of 6-10 MPa $m^{1/2}$ with a hardness of 140-180 GPa with indications that they may be harder.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A single crystal diamond grown by microwave plasma chemical vapor deposition annealed at pressures in excess of 4.0 GPa and heated to temperature in excess of 1500 degrees C. that has a hardness of greater than about 140 GPa, wherein the fracture toughness is >20 MPa $m^{1/2}$.

* * * * *